United States Patent [19]

Furkay et al.

[11] Patent Number: 5,896,303
[45] Date of Patent: Apr. 20, 1999

[54] DISCRETIZATION TECHNIQUE FOR MULTI-DIMENSIONAL SEMICONDUCTOR DEVICE SIMULATION

[75] Inventors: Stephen Scott Furkay, South Burlington; Jeffrey Bowman Johnson, Essex Junction, both of Vt.

[73] Assignee: International Business Machines Corporation, Armonk, N.Y.

[21] Appl. No.: 08/729,464

[22] Filed: Oct. 11, 1996

[51] Int. Cl.[6] .................................................. G06F 19/00
[52] U.S. Cl. .......................... 364/578; 364/490; 364/488; 364/489
[58] Field of Search ................................ 364/578, 488, 364/489, 490, 491; 395/500

[56] References Cited

U.S. PATENT DOCUMENTS

| | | | |
|---|---|---|---|
| 4,933,889 | 6/1990 | Meshkat et al. | 364/578 |
| 4,941,114 | 7/1990 | Shigyo et al. | 364/578 |
| 4,969,116 | 11/1990 | Wada et al. | 364/578 |
| 4,972,334 | 11/1990 | Yamabe et al. | 364/200 |
| 5,070,469 | 12/1991 | Kunikiyo et al. | 364/578 |
| 5,282,140 | 1/1994 | Tazawa et al. | 364/468 |
| 5,315,537 | 5/1994 | Blacker | 364/570 |
| 5,367,465 | 11/1994 | Tazawa et al. | 364/468 |
| 5,386,374 | 1/1995 | Meng | 364/578 |
| 5,416,729 | 5/1995 | Leon et al. | 364/578 |
| 5,471,403 | 11/1995 | Fujimaga | 364/488 |
| 5,617,322 | 4/1997 | Yokota | 364/464.04 |
| 5,675,522 | 10/1997 | Akiyama | 364/578 |
| 5,677,846 | 10/1997 | Kumashiro | 364/488 |
| 5,684,723 | 11/1997 | Nakadai | 364/578 |
| 5,768,156 | 1/1998 | Tautges et al. | 364/578 |

*Primary Examiner*—Kevin J. Teska
*Assistant Examiner*—A. S. Roberts
*Attorney, Agent, or Firm*—Schmeiser, Olsen & Watts; Richard M. Kotulak

[57] ABSTRACT

Disclosed is a method of improved grid generation for semiconductor device simulation. In particular, the invention includes a simple method for locating critical interfaces (e.g., oxide-silicon interfaces) and then utilizing the information to generate finer mesh elements near those boundaries where device behavior is most critical. The method of identifying critical interfaces includes the steps of examining the boundary data for each material region in the device, and then generating normal lines between adjacent boundaries to identify "thin" regions, which are generally associated with the critical interfaces. Once this occurs, a recursive subdivision algorithm may be utilized to generate a grid whose element dimensions are dependent upon their proximity to identified critical regions.

22 Claims, 10 Drawing Sheets

5,896,303

DISCRETIZATION TECHNIQUE FOR MULTI-DIMENSIONAL SEMICONDUCTOR DEVICE SIMULATION

BACKGROUND OF THE INVENTION

1. Technical Field

The present invention relates to semiconductor device simulation and more particularly to a method of automating the discretization of two and three dimensional semiconductor device representations.

2. Related Art

Computer based simulations have become an integral part of semiconductor manufacturing because they allow chip designers to study and predict the electrical behavioral characteristics of a semiconductor device before it is ever manufactured. Semiconductor device simulation is increasingly used in the microelectronics industry for reducing hardware experiments and technology development time, for producing more manufacturable and higher-performance designs, and for reducing product time to market. Concommitent with the increased use of simulation is a trend to apply simulation to increasingly complex structures and increasingly complex physical phenomena. Unfortunately, because known simulation techniques require a significant amount of computational resources, severe time and computer processing limitations presently exist.

Semiconductor-device simulation is typically accomplished by first generating a two or three dimensional computer representation of the structure that includes various material regions. Next, the structure is subdivided into a mesh structure that includes numerous grid points which constitute the vertices of the subdivided regions. The mathematical equations describing the physical phenomena that determine the electrical characteristics of the semiconductor device are then solved on the mesh subdivisions. The typical result of the solution is a set of physical quantities defined at each grid point. Typical physical quantities are electric potential, positive and negative carrier concentrations, semiconductor atomic lattice temperature and average carrier temperature. The grid points can then be used to create mathematical equations that describe the characteristics of the device. In general, it is desirable to have a high number of grid points to create an accurate simulation. Unfortunately, as the number of grid points increases, the computation burden of solving the equations also increases.

As noted above, the computation burden of performing simulations is further affected by the fact that silicon devices are becoming more and more complex. For example, beginning with the 16 Mb generation of semiconductor devices, practically all dynamic random access memory (DRAM) cell design issues are three dimensional in nature. Three-dimensional simulation poses an order-of-magnitude greater computational burden compared to the more typical two dimensional simulation.

In addition, silicon-on-insulator (SOI) technology, is becoming increasingly attractive as the drive to denser integrated circuits, composed of smaller devices and utilizing lower power supplies, proceeds. SOI device structures are significantly more complex than the commonly used bulk silicon devices, and the operation is based on physical phenomena that are more complex than those driving bulk devices. Physically accurate simulations of SOI devices may require solution of up to twice the number of equations required by less complex structures.

Moreover, there is a growing demand for a "design-for-manufacturing" (DFM) approach to using simulation. In this approach, hundreds of distinct simulations of a given design point are performed in order to cover the range of perturbations experienced in a manufacturing environment. This approach to simulation obviates the present paradigm in which engineers manually prepare and submit simulations.

Finally, the shrinking dimensions of modem and future transistors makes quantum-mechanical physical effects more and more prevalent. Solving the partial differential equations that describe these effects is a much more computationally intensive process than the semiclassical equations now routinely used to simulate semiconductor device operation.

Thus, without a more efficient method of performing simulations, designing and manufacturing of semiconductor devices will be severely limited. The aforementioned technology references and prior art are herein included by reference.

SUMMARY OF THE INVENTION

The present invention provides a method and program product for grid generation for semiconductor-device simulation. In particular, the present invention distributes grid points in a non-uniform manner such that there is a greater density of grid points at crucial oxide-silicon interfaces existing within two and three dimensional semiconductor-device structures. The method includes a mesh generation program that examines the thickness of the insulator structure contacting each piece of semiconductor and discretizes the structure according to a simple, general rule. This will produce an efficient mesh in the sense that a fine density of grid nodes are placed only where required for resolution of critical device behavior, minimizing the computational burden required for accurate numerical simulation of the device's electrical behavior.

In a first embodiment, a semiconductor device simulation is stored in a computer data base that includes a geometric structure for each of the materials that make up the semiconductor device, along with the respective chemical properties of the device. Next, a set of data representing the boundaries for each of the materials within the structure is extracted and examined. From those boundaries, semiconductor-insulator interfaces are identified as being materials having a thickness less than a predetermined, user definable amount. The preferred means of determining material thickness includes generating a plurality of normal lines from a first boundary until it intersects with a second boundary and then calculating and storing the distance. Next, a recursive subdivision algorithm is applied to the structure to generate subdivisions such that the fineness of each subdivision is dependent upon a distance of each subdivision to one or more semiconductor/insulator interfaces. In particular, the method will examine the normal or perpendicular distance of each subdivision to an interface to determine the size of each subdivision element. Finally, the vertices formed from the subdivision along with the geometric structure, along with any intersections between the structure of boundaries and the subdivision sides, are used as grid nodes for a new mesh created for the device to be simulated.

A second preferred embodiment includes the steps of storing the semiconductor simulation in a computer data base in the same manner as the first embodiment and extracting boundary data also in a similar manner. In the second embodiment, however, the material regions defined by the boundary data are first subdivided according to a set of predefined geometric criteria to produce a coarse starting mesh consisting of a plurality of mesh elements. Next, the geometric definitions for each of the material regions is calculated using normal lines in the same manner as embodiment one. Likewise, certain boundaries are identified as semiconductor-insulator interfaces based upon the thickness of the material regions. Finally, certain of the mesh elements are then further subdivided based upon their proximity to a semiconductor-insulator interface. Subdividing continues until a predetermined criteria is met.

It is therefore an advantage of the present invention to provide a method of automatically generating grid points for semiconductor device simulation.

It is therefore a further advantage of the present invention to provide a method where the fineness of mesh element generation is dependent upon the proximity of each mesh element to a semiconductor/insulator interface.

It is therefore a further advantage of the present invention to provide a method of reducing the computational burden involved in semiconductor device simulation.

It is therefore a further advantage of the present invention to provide a method of automatically identifying semiconductor/insulator interfaces.

The foregoing and other objects, features and advantages of the invention will be more apparent from the following more particular description of the preferred embodiments of the invention as illustrated in the accompanying drawings.

BRIEF DESCRIPTION OF DRAWINGS

The preferred exemplary embodiment of the present invention will hereinafter be described in conjunction with the appended drawings, where like designations denote like elements and.

BEST MODE FOR CARRYING OUT THE INVENTION

Device Simulation Background

Figure 1:
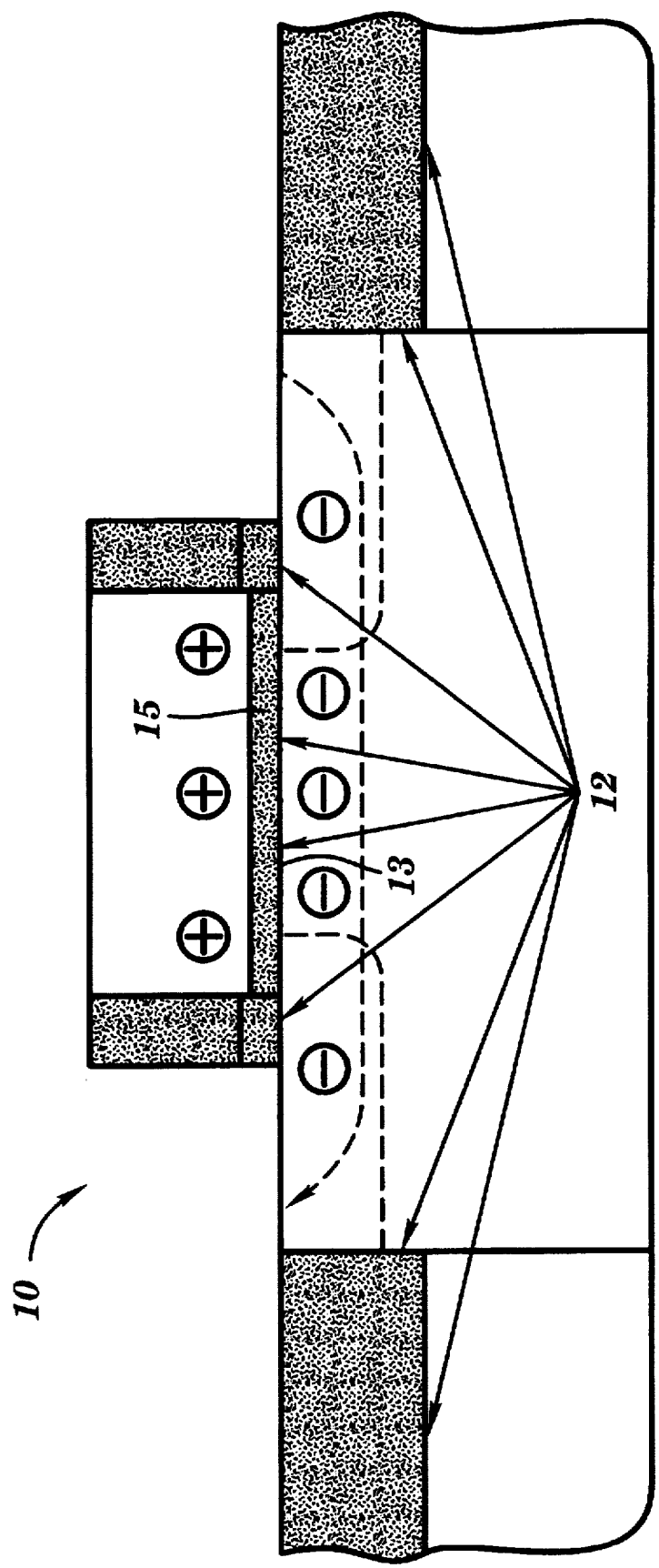
FIG. 1 depicts a cross-sectional view of a polysilicon gate field-effect transistor (FET).

A typical semiconductor device simulation includes the following steps. First, a two or three dimensional representation of the structure is created, including material shapes, electrical properties, chemical composition and boundary conditions. Next, the structure is subdivided into pieces of the same general type, usually a non-overwrapping set of simplices (e.g., triangles or tetrahedra) that completely fill the structure. The points in space that define these subdivisions are called "grid points", the set of subdivisions is called a "mesh", the subdivisions are called elements, and the process of physical subdivision is commonly called "grid generation" (the points) and "mesh generation" (connecting the points). Next, the physical equations of interest, almost always a set of coupled, non-linear partial differential equations, are specified. Typically, they define scalar values of physical quantities of electrical characteristics that determine the device's electrical behavior. Each grid point is associated with a value of each of these physical quantities. Finally, the subdivided structure is read by a computer program which then solves the requested set of equations on the mesh and calculates and reports the device's electrical characteristics.

The critical, or enabling step in the device simulation process involves the grid/mesh generation. It determines both the accuracy of the simulation solution as well as the computational burden required to arrive at the solution. A "good" mesh will provide an accurate answer, which essentially means a fine subdivision of the regions of the device structure that drive its operation, with low computational burden, which generally means with as few grid points in the mesh as possible. Unfortunately, until now, the industry lacks an automated method for generating a "good" mesh.

All semiconductor-device simulation is based on repeated solutions of a set of linear equations in the form of a matrix equation $$Ax=b$$

where A is an n×n matrix and x and b are n×1 vectors. Note that "n" is the number of differential equations being solved times the number of grid points in the mesh. The CPU time, "t," required to solve this set of equations have been found to be of the form $$t=k \times n^{**}c$$

where the constants k and c are characteristics of the particular matrix solution method being used, with those typical of semiconductor-device simulation characterized by 1.7<c<2. Therefore, the most direct way to decrease CPU time for a simulation is to reduce n in the above equation. But it must be done in a way that does not degrade solution accuracy, which is never decreased, and typically increased, by larger n.

As device structures become more complex, with a corresponding increase in complexity of the physical phenomena being modeled, and with increase requirements for the simulations to be done in three-dimensions, efficient control of the problem size, n, will be required in order to enable semiconductor-device simulation to maximize its contribution to microelectronics product development.

For the last decade, and for the foreseeable future, metal-oxide-semiconductor (MOS) transistor and DRAM cell engineering will drive microelectronics productivity and profit. Simulation of the essentially infinite variety of these devices is a major task of semiconductor-device simulation. The physical behavior of these devices is dominated by the accumulation and transport of mobile electrical charge at the oxide/semiconductor (usually silicon) boundary or interface formed by the extremely thin (typically less than 10 nanometers for high performance transistors) "gate oxide". Thus, simulating these devices requires a fine subdivision of the MOS structure at the gate-oxide semiconductor interfaces of the structure in order to accurately model the electrical behavior characterizing the particular MOS transistor design being examined. However, as can be seen in FIG. 1, there are many silicon/oxide interfaces in a MOS structure, but only the one associated with the gate oxide determines the device electrical characteristics.

Preferred Embodiments

Referring now to the drawings, FIG. 1 depicts a cross-sectional view of a metal oxide semi-conductor transistor (MOS) 10. Transistor 10 depicts a typical device for which semi-conductor-device simulation may be required. It can be seen that there are many silicon/oxide interfaces 12 in a MOS structure, but only one interface 13 that is associated with the gate oxide region 15 which drives the device's electrical characteristics. Thus, the ideal grid for performing simulation would have finer mesh elements along the gate-oxide interface 13 than elsewhere on the structure.

Figure 2:
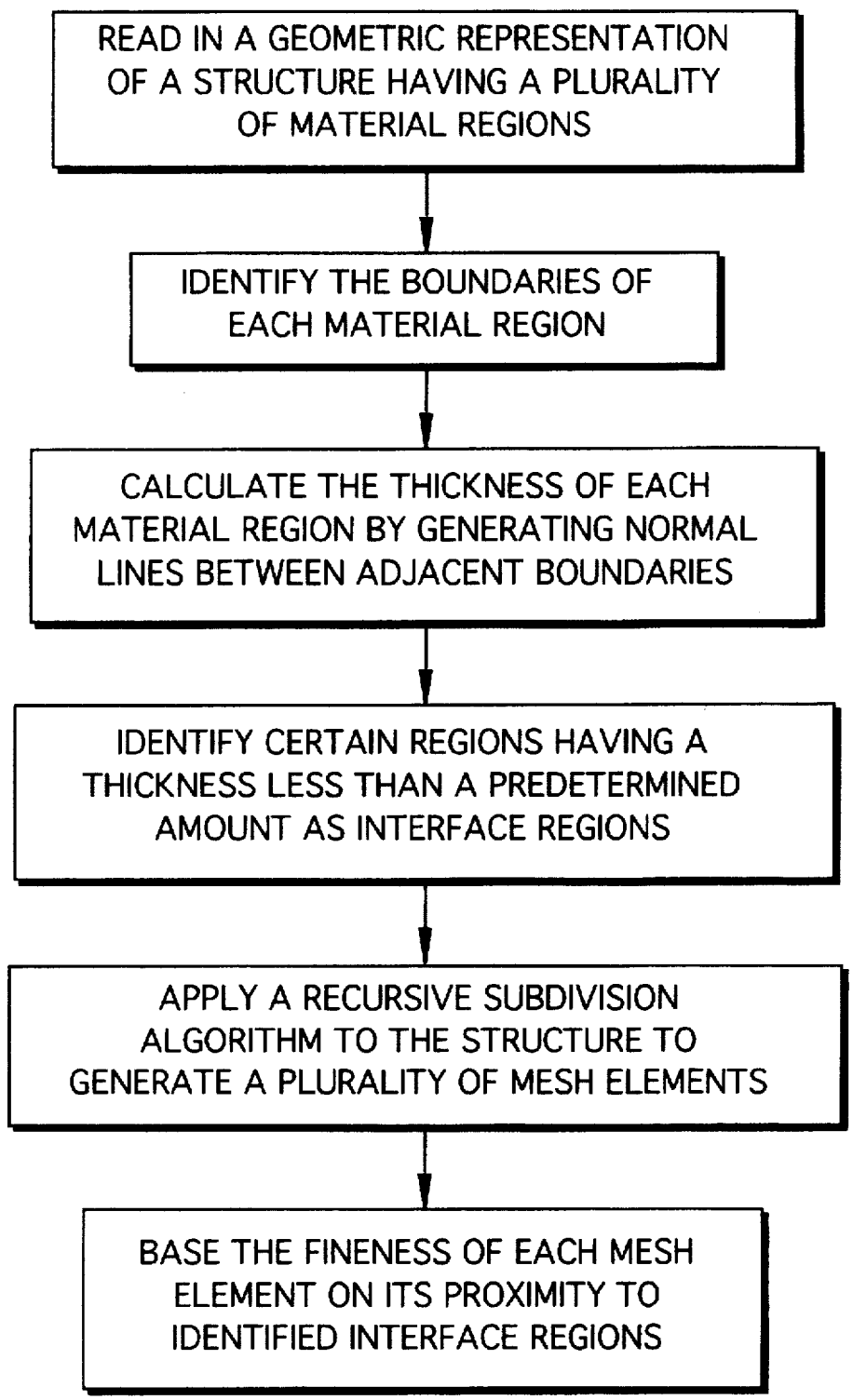
FIG. 2 depicts a flow diagram showing a method of generating a grid in accordance with a preferred embodiment of the present invention.

Referring now to FIG. 2, a flow diagram is shown depicting a method of generating a grid. Pursuant to this method, certain grid elements within the structure being simulated will have finer mesh elements depending upon their proximity to thin material regions. The first step of the method is to read a geometric representation of a structure having a plurality of material regions into a computer data base. It should be recognized that any type of geometric representation may be utilized. In addition, it is recognized that while the structure may involve a transistor device, it may also involve any other materials that have changing boundary layer conditions to which a simulation may be applied.

Figure 3:
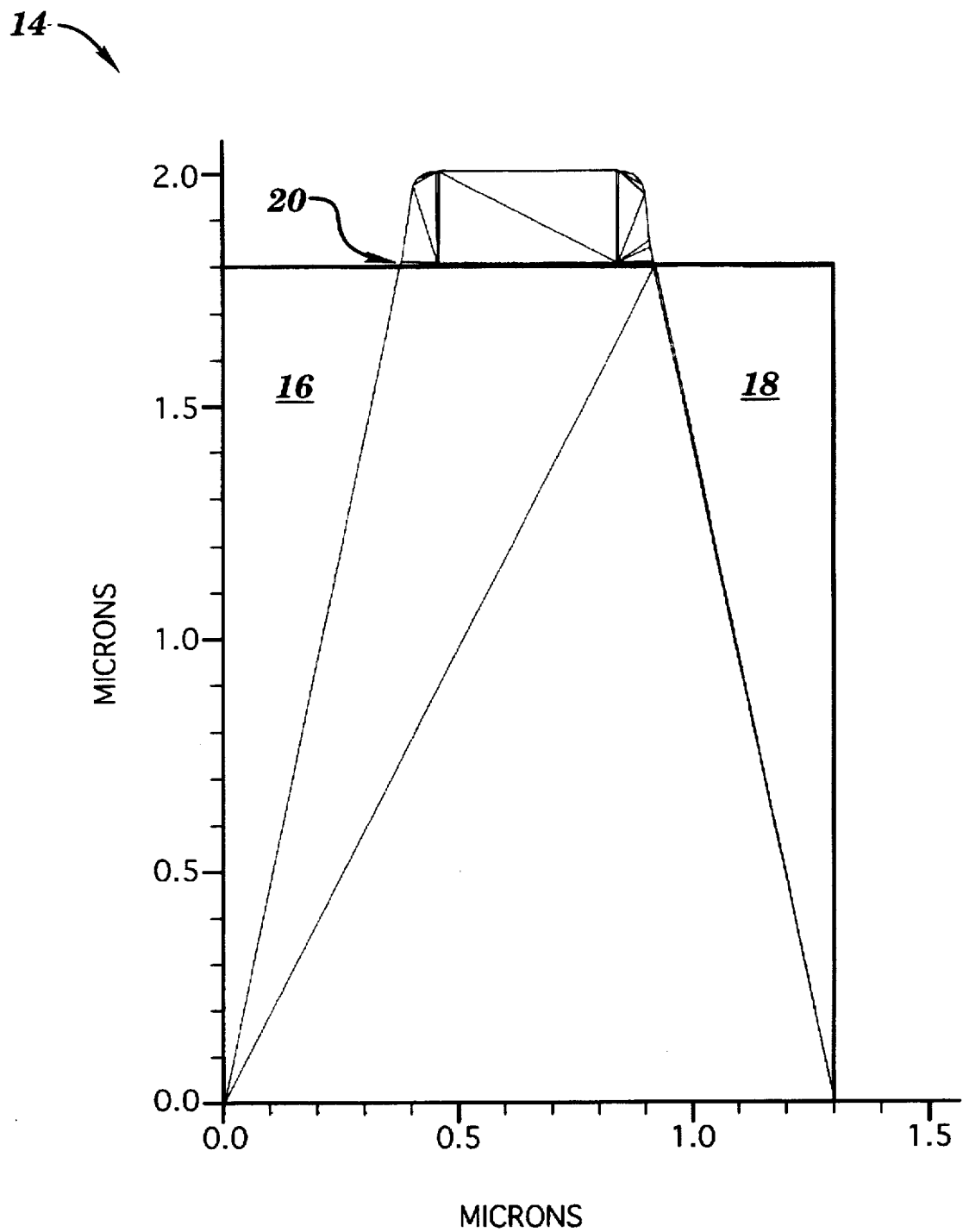
FIG. 3 depicts a graphical representation of a FET cross-section stored as small set of triangle mesh elements.

The next step is to identify, or extract, the boundary information of each of the material regions that make up the structure. In the case of a transistor device, these boundaries will define the source and drain areas, poly-silicon areas, silicon areas, oxide areas, nitride areas, and gate oxide areas. The boundary information typically consists of a set of connected lines in two dimensions, or a set of planes in three-dimensions defining three-dimensional polygons. However, it is recognized that the boundary information need not be any special reduction or transformation of the device representation. FIG. 3 illustrates one method of storing the boundaries of a two-dimensional transistor cross-section. In FIG. 3, a minimal set of triangle elements that preserve the device structure are shown and include source 16 and drain 18, along with the critical interface region 20.

Figure 4:
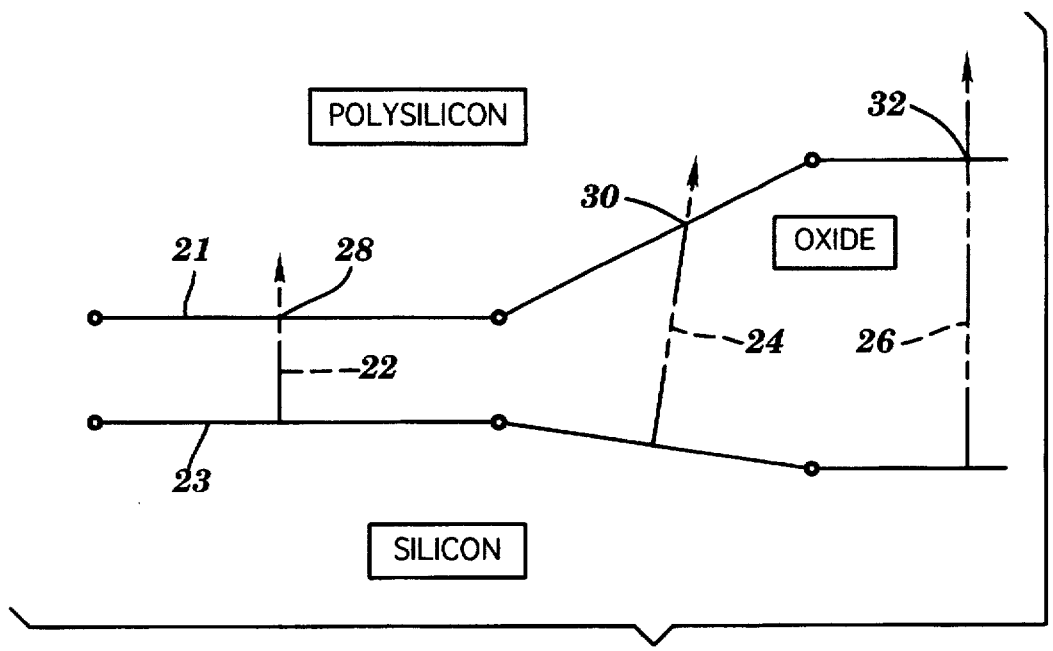
FIG. 4 depicts normal lines extending between the boundaries of the thin-insulator region of a FET in accordance with a preferred embodiment of the present invention.
Figure 5:
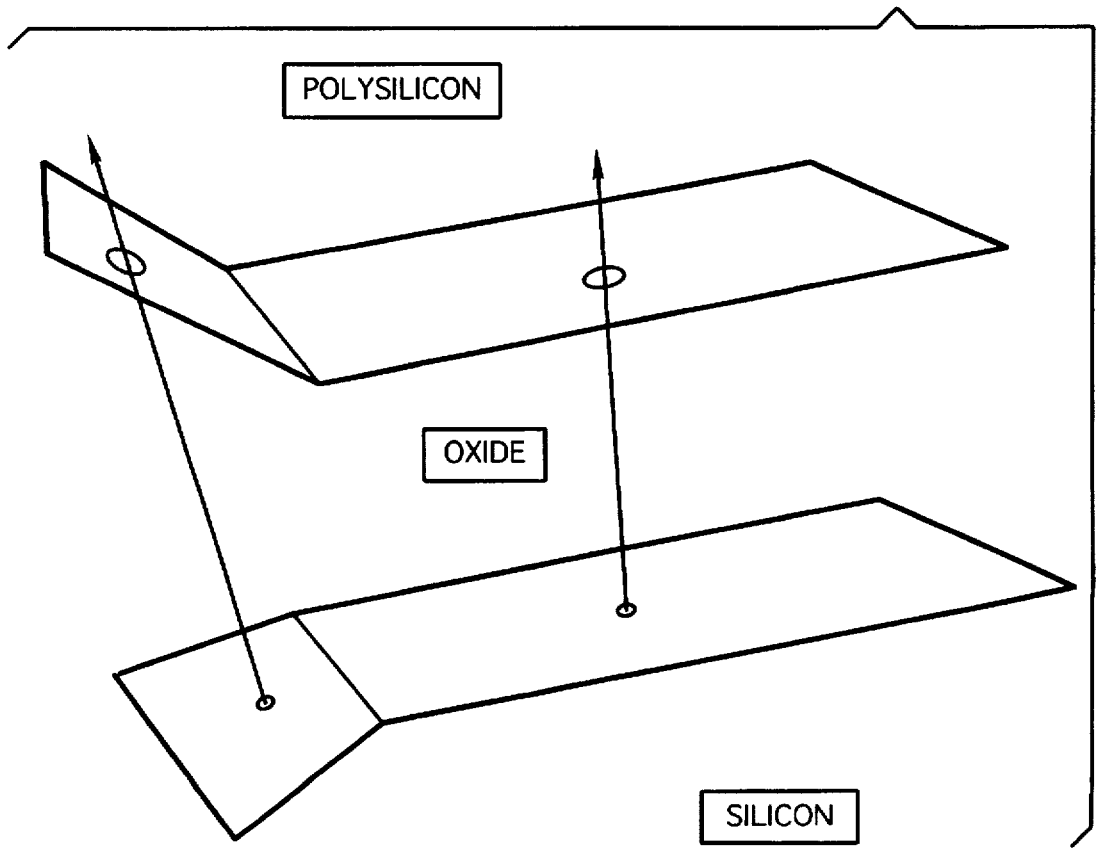
FIG. 5 depicts normal lines generated between three-dimensional boundaries of the thin-insulator region of a FET in accordance with a preferred embodiment of the present invention.

Next, the thickness of each material region is calculated. The preferred method of calculating thicknesses is to generate normal lines (perpendicular to the semiconductor interface and pointing into the insulating region) between the "line" boundaries in two dimensions, or "plane" boundaries in three dimensions. The intersection points of each normal line between adjacent boundaries on the device can be used to calculate a distance, which provides a thickness for a particular material region. Where the distance between the intersection points is less than a predetermined amount, the material region may be identified as a special interface region. In the case of a transistor device, this area would be defined or identified as a semiconductor-insulator (i.e., gate-oxide) interface. Thus, distance data calculated by generating normal lines may then be stored and associated with particular portions of each semiconductor-insulator interface region. FIG. 4 depicts how a normal line would be generated in two dimensions while FIG. 5 depicts how it would be generated in three dimensions. In FIG. 4, it can be seen that normal lines 22, 24 and 26 are generated from a first border line 23 toward a second border line 21 where they intersect at points 28, 30 and 32.

Once the interface regions are identified, a recursive subdivision algorithm may be applied to the structure to generate a plurality of mesh elements. Examples of recursive subdivision algorithms include a quadtree algorithm for two dimensions, an octree algorithm for three dimensions, or an anisotropic extension of either of these. It should be recognized that any recursive subdivision algorithm may be utilized for this step.

Figure 6:
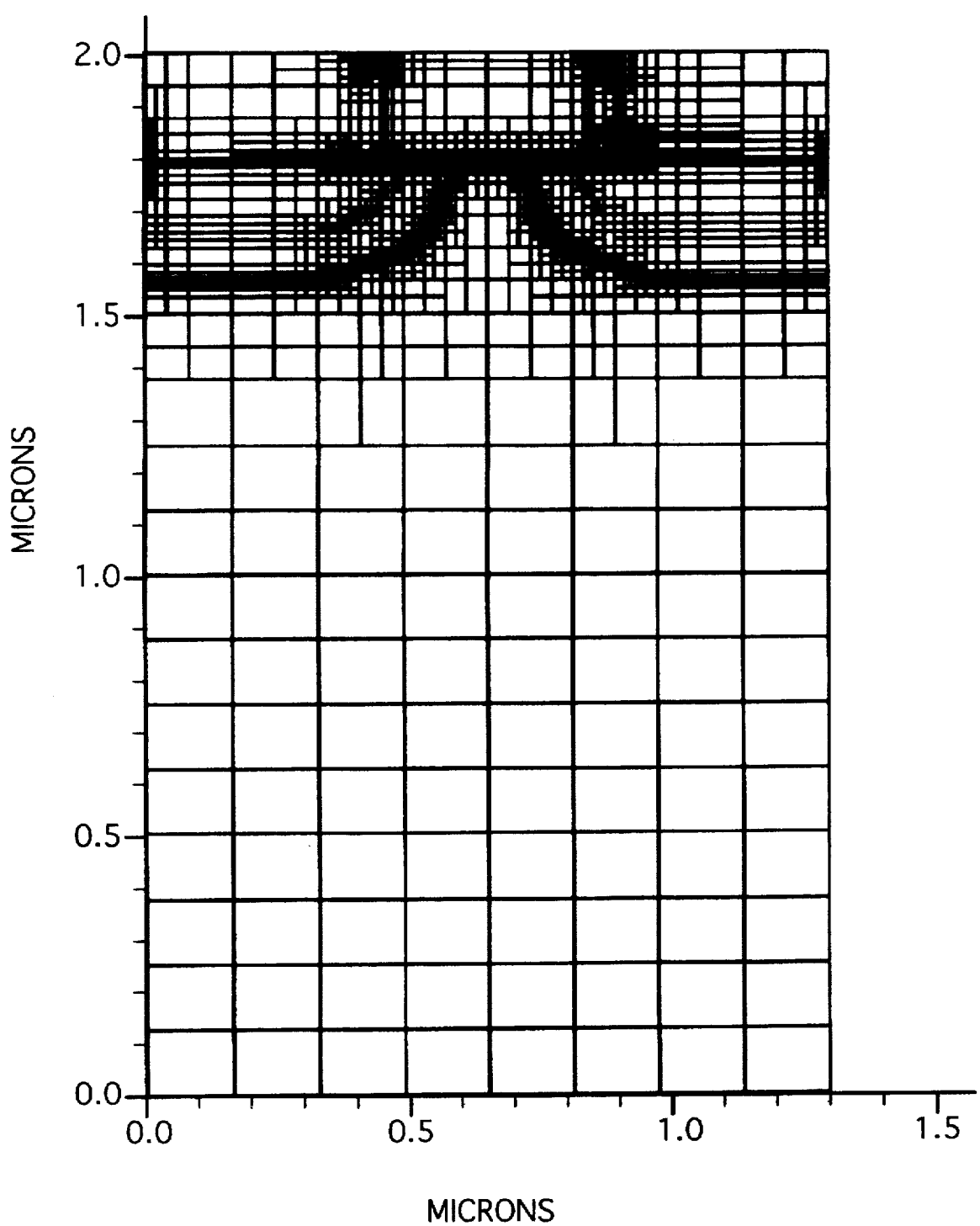
FIG. 6 depicts a graphical representation of a semiconductor device after a recursive subdivision algorithm was applied thereto in accordance with a preferred embodiment of the present invention.

The fineness of each mesh element being generated by the recursive subdivision algorithm is based upon the element's proximity to the identified interface regions. In particular, with respect to transistor devices, those subdivisions that are closer to semiconductor-insulation interfaces will be of a finer dimension than those that are farther away. One method of achieving this may be as follows. When a subdivision is to determine to contain a semiconductor-insulator interface, it is denoted in its data structure as an "interface subdivision". Then, the distance from some point characteristic of this subdivision (e.g., its mid-point) to some point characteristic of the interface (e.g., the point on the interface closest to the mid-point of the subdivision) is stored in the data structure defining this subdivision. Next, as each new subdivision is created (by subdividing, into "children," an existing subdivision, called a "parent"), the data structures for the parent subdivision are examined. If the parent subdivision was an "interface subdivision," the distance and direction for each child is determined and stored with the child's data structure. This process continues until all subdivisions within a certain distance of a semiconductor-insulator interface are of a predetermined user controlled fineness in a direction perpendicular to the closest "interfaced subdivision." Thus, the important, thin, gate-oxide interfaces which contribute heavily to the device behavior will have a dense concentration of grid points located nearby. Conversely, other interfaces which do not contribute significantly to device behavior will require and receive fewer subdivisions and grid points. This methodology allows grid nodes to automatically be placed only in regions expected to support crucial device behavior. FIG. 6 represents a graphical representation of a transistor device cross-section in which a bitree recursive subdivision algorithm was applied with the crucial region identified. Note the fine gird point spacing at the silicon/gate-oxide interface near the source and drain junctions.

Figure 7:
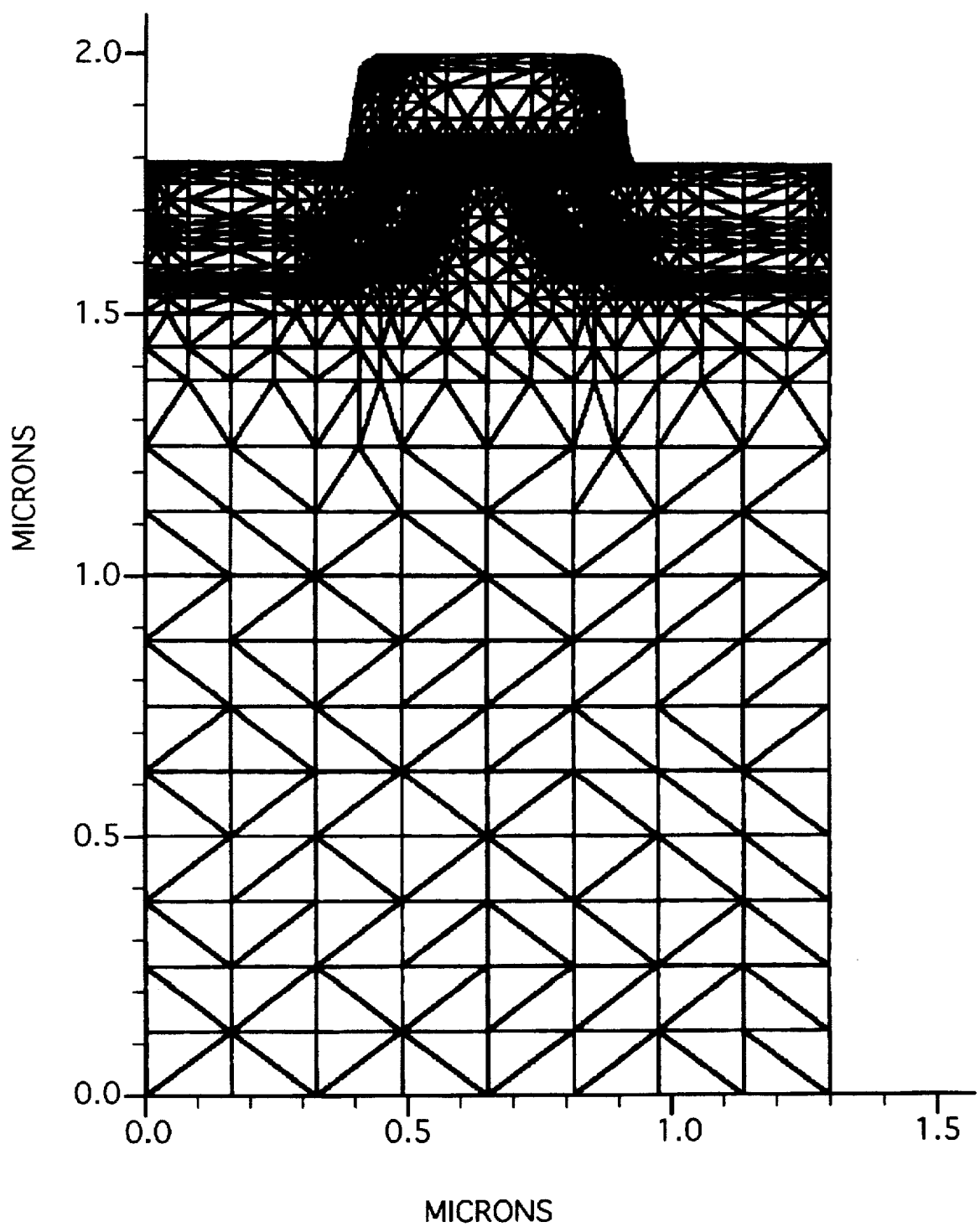
FIG. 7 depicts a graphical representation of a semiconductor device showing a resulting mesh generated in accordance with a preferred embodiment of the present invention.

Finally, when the recursive subdivision has met all of the refinement criteria, the vertices that form the subdivisions, along with the vertices that determine the device structure, along with any intersections between the structure boundaries and the subdivision sides, are used as grid nodes for a new mesh created for the device to be simulated. Grid node generation may be accomplished via anyone of the known incremental, unstructured two or three dimensional mesh generation algorithms presently known in the art. FIG. 7 depicts a final mesh representation, ready for simulation of electrical characteristics. Based on experiments performed pursuant to the methodology of embodiment one, expected CPU savings for device simulations based on structures created by this methodology may range anywhere from 15% for structures with few, simple interfaces, to 97% for structures with numerous, complex interface regions.

Figure 8:
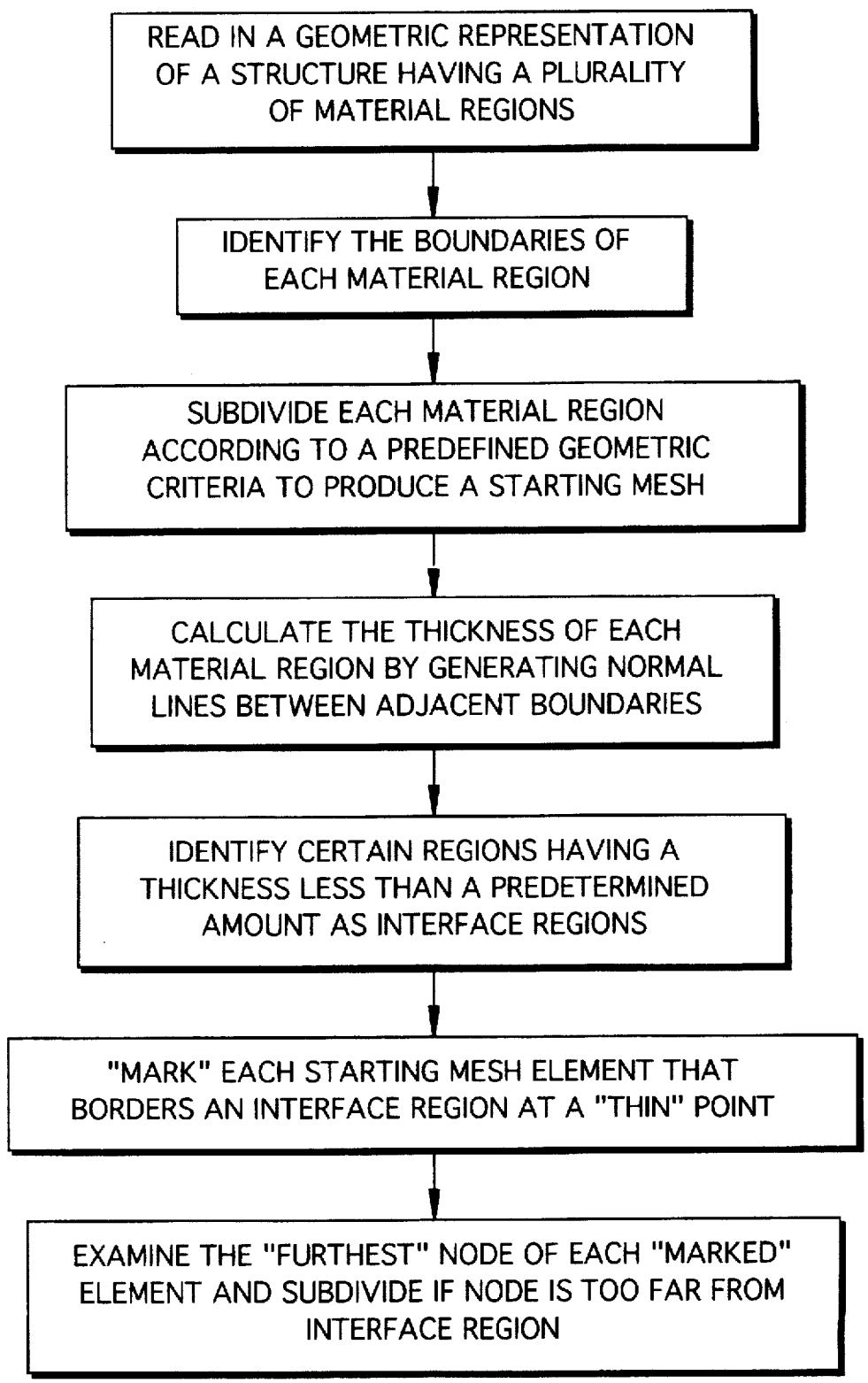
FIG. 8 depicts a flow diagram of a method of generating a grid in accordance with a second preferred embodiment of the present invention.

Referring now to FIG. 8, a second embodiment of the present invention is shown in a flow diagram. Similar to the first embodiment, a geometric representation of a structure having a plurality of material regions is read into a data base, and its boundaries are then identified. Again, the boundary information will consist of a set of connected lines in two dimensions or planes and three dimensions which collectively define all of the distinct material regions which comprise the entire device. Thus, each material region is formed as a polygon or polyhedron. Each material region (i.e., polygon or polyhedron) is then successively subdivided according to a set of predefined geometric criteria to produce a coarse starting mesh.

Figure 9:
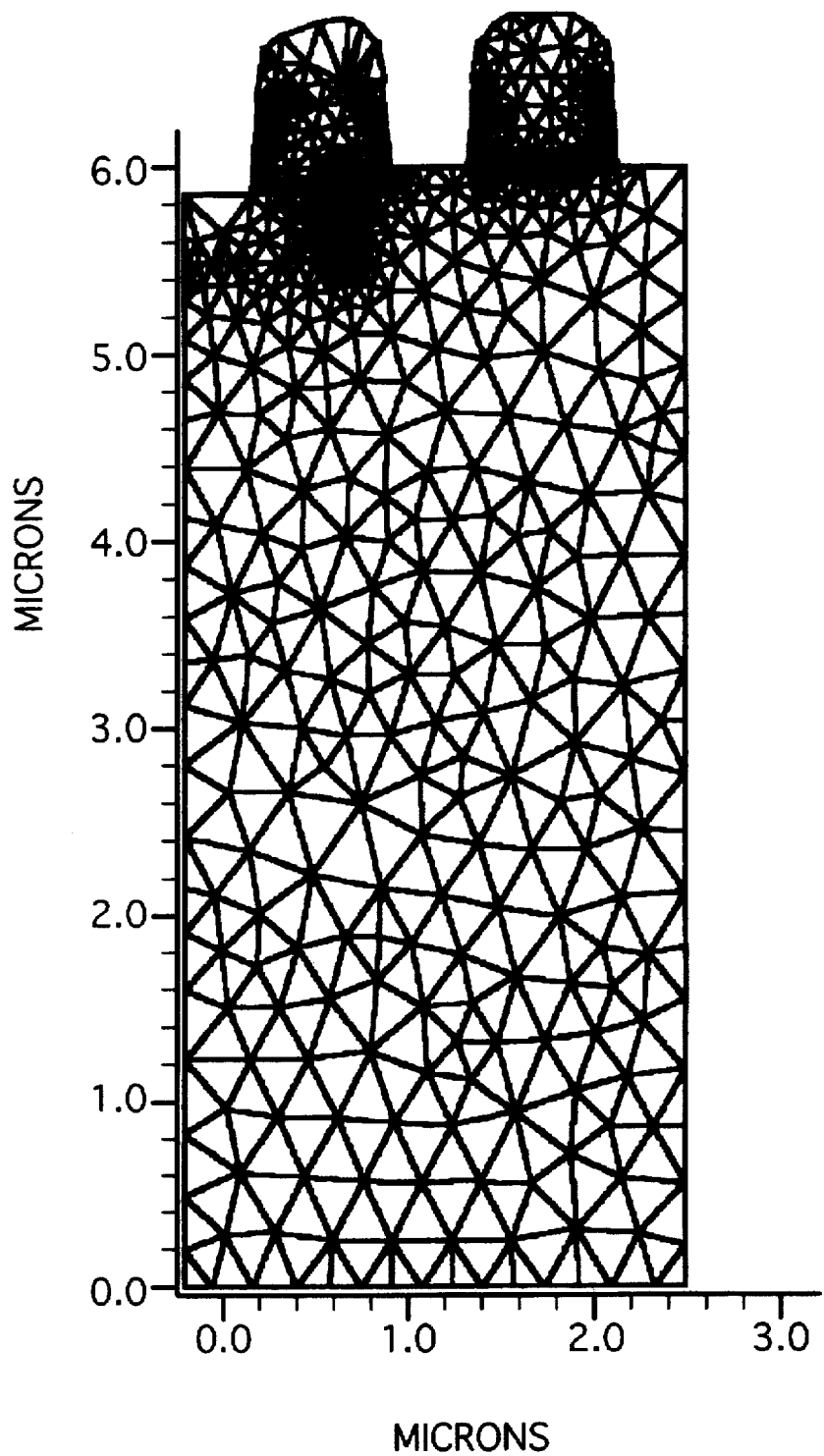
FIG. 9 depicts a graphical representation of a transistor device that includes a starting mesh in accordance with a second preferred embodiment of the present invention.

FIG. 9 depicts a device with a starting mesh generated with a laplacian smoothing technique. It is recognized that any known method of subdividing may be utilized. Next, similar to embodiment one, the thickness of each material region is calculated by generating normal lines between adjacent boundaries to identify semiconductor/insulator interfaces (in the same manner as described above). Then, each element of the starting mesh is marked if it happens to lie along one of these interfaces, and if the insulator layer is not too thick at that point. Determination of the local insulator thickness is also accomplished in the same manner as described above). For each marked element, if the node farthest away from the interface is greater than a user defined distance, the element is subdivided in a direction perpendicular to the interface. The elements resulting from this subdivision themselves are then marked and again checked for further subdivision. The process of refining each element proceeds until all user specified criteria is met.

Figure 10:
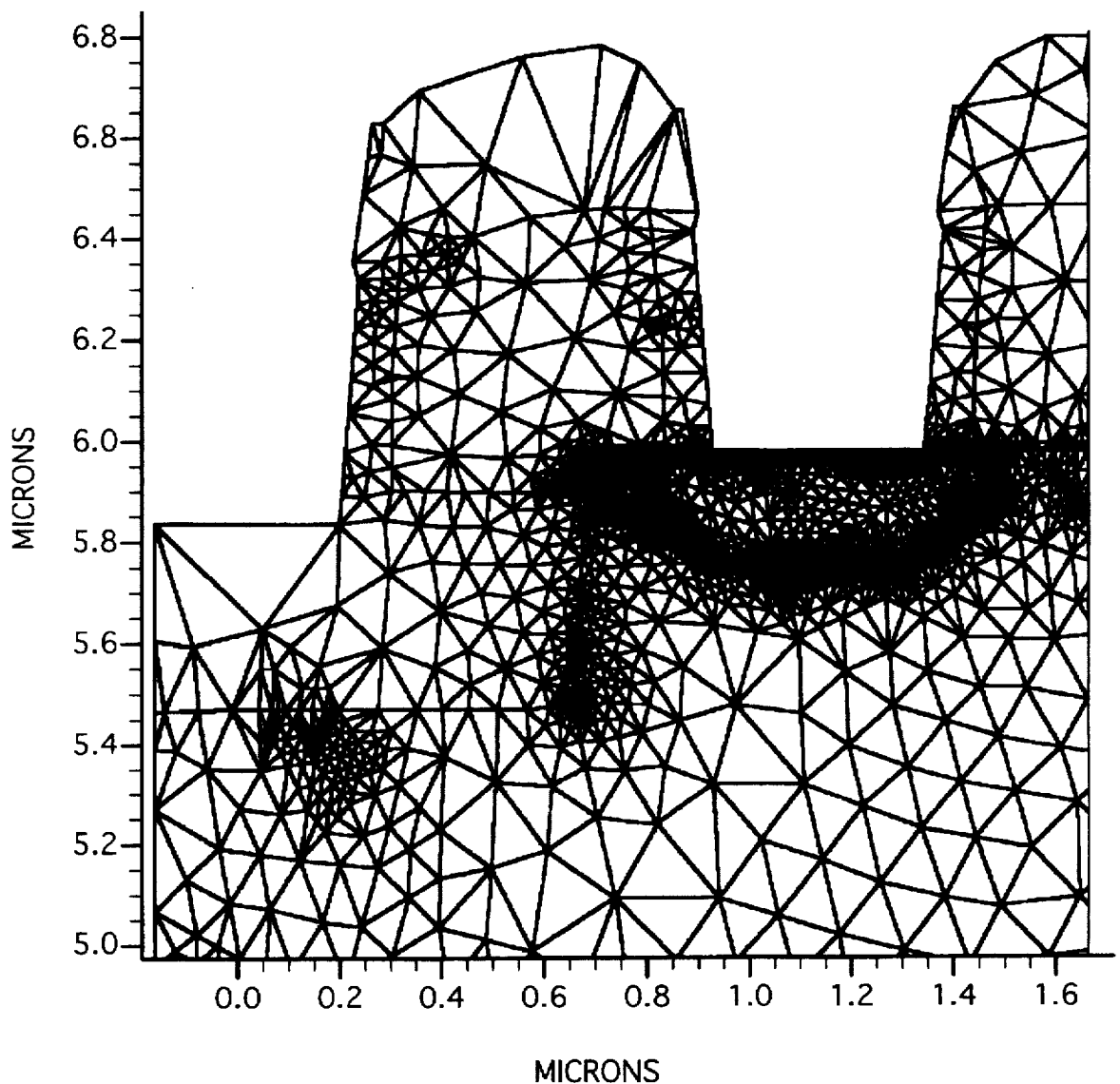
FIG. 10 depicts a graphical representation of a transistor structure that includes a generated grid in accordance with a preferred embodiment of the present invention.
Figure 11:
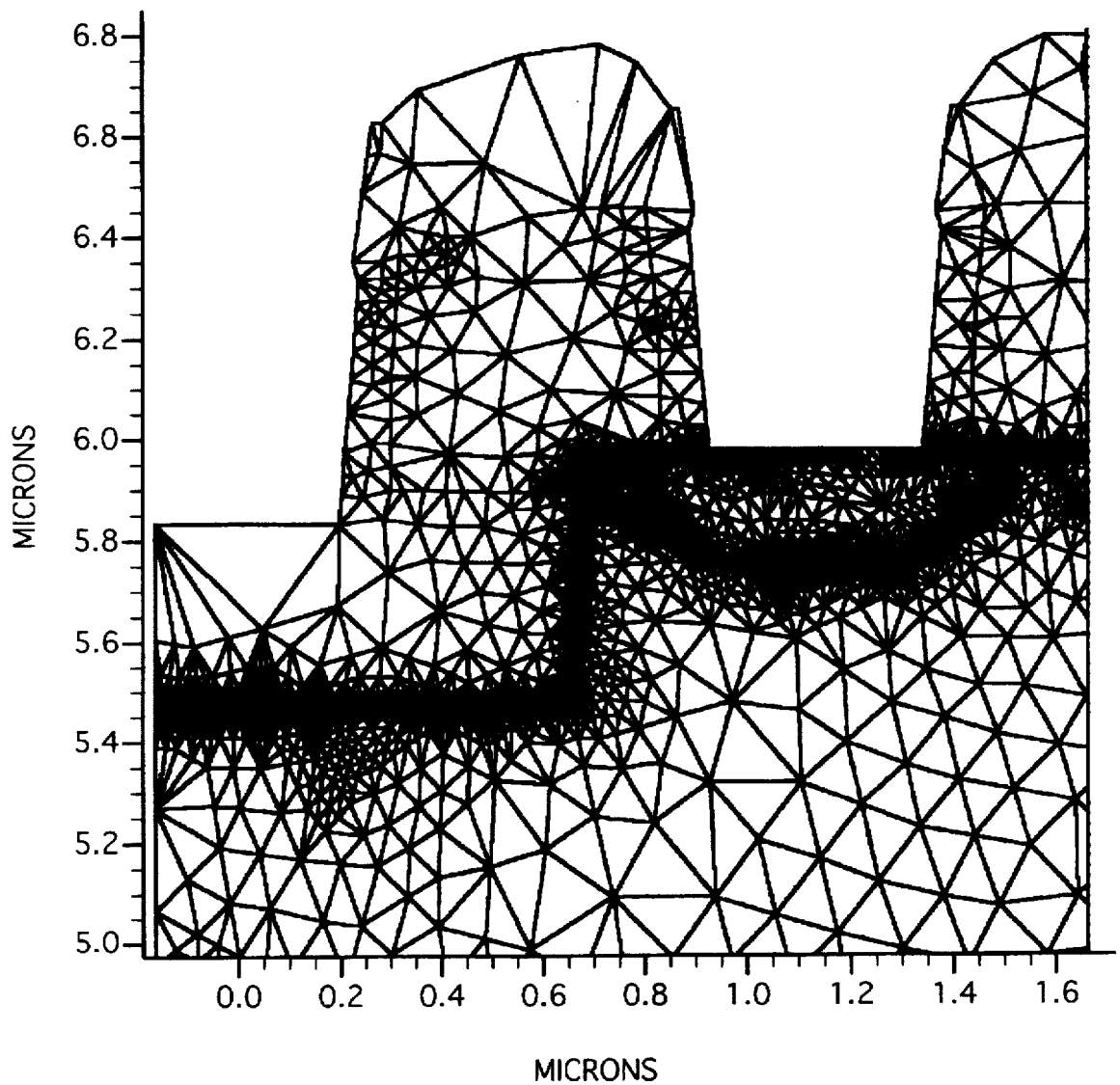
FIG. 11 depicts a graphical representation of a transistor device that includes a generated grid that does not include the methodology of the present invention.

FIG. 10 depicts a close-up view of a structure with the thickness criteria enforced, while FIG. 11 depicts the same structure without the insulator thickness criteria enforced. The significant reduction in node count is clearly evident for interfaces adjacent to the thick oxide. Expected CPU savings for device simulations based on structures created with this method may range anywhere from 37%, for structures with few, simple interfaces, to 90% for structures with numerous, complex interface regions.

While the invention has been particularly shown and described with reference to a few preferred exemplary embodiments thereof, it will be understood by those skilled in the art that various changes and form and details may be made therein without departing from the spirit and scope of the invention. It is also recognized that the steps and methods described above can be readily incorporated into a software program product by those skilled in the art.

We claim:

1. A method for generating a grid for simulating physical properties of a structure wherein said structure has a plurality of materials subject to changing boundary layer conditions, said method comprising the steps of:
   reading into a computer a geometric representation of said structure wherein said representation includes a plurality of boundaries for each of said materials;
   calculating dimensions for each of said materials by computing a plurality of normal distances between adjacent boundaries within said structure;
   identifying an interface material from said plurality of materials, based on said calculated dimensions of said plurality of materials;
   subdividing said structure using a recursive subdivision algorithm wherein a fineness of each subdivision is dependent upon a perpendicular proximity of the subdivision to said interface materials; and
   using vertices from the generated subdivisions along with said geometric representation as grid nodes.

2. The method of claim 1 wherein the calculating step calculates a thickness of each material, and wherein the identifing step identifies said interface material as one of the plurality of materials having a thickness less than a predetermined amount.

3. The method of claim 1 wherein the fineness of each subdivision is further dependent upon the chemical composition of the materials.

4. The method of claim 1 wherein said geometric representation is a two dimensional representation.

5. The method of claim 1 wherein said geometric representation is a three dimensional representation.

6. The method of claim 4 wherein said subdivision algorithm is a quadtree algorithm.

7. The method of claim 5 wherein said subdivision algorithm is an octree algorithm.

8. A method of grid node generation for simulating semiconductor devices, said method comprising the steps of:
   storing in a computer data base a semiconductor device simulation wherein said simulation includes a geometric structure of a plurality of materials that make up the semiconductor device, along with their respective chemical properties;
   extracting a set of data representing boundaries for each of said materials within the structure;
   identifying semiconductor-insulator interfaces as those materials having a thickness less than a predetermined amount, said identifying step including:
      generating a plurality of normal lines from each of said boundaries; and
      for each normal line, calculating and storing a distance to an adjacent boundary;
   applying a recursive subdivision algorithm to said structure to generate a plurality of subdivisions wherein a fineness of said subdivisions is dependent upon a perpendicular distance of each subdivision to one or more semiconductor-insulator interfaces; and
   using vertices formed from said subdivisions, along with said geometric structure, as grid nodes for simulation purposes.

9. The method of claim 8 wherein said set of data representing boundaries includes a set of connected lines in two dimensions.

10. The method of claim 8 wherein said set of data representing boundaries includes a set of planes defining a plurality of three dimensional polygons.

11. The method of claim 8 further comprising the step of denoting in said data structure those subdivisions that border said semiconductor-insulator interface.

12. The method of claim 11 wherein each subdivision denoted as bordering said semiconductor-insulator interface further includes a midpoint distance to said semiconductor-insulator interface which is also recorded in said data structure.

13. The method of claim 12 further comprising the step of storing in said data structure, data for new child subdivisions whose parent borders said semiconductor-insulator interface, said data including distance and direction to at least one semiconductor-insulator interface.

14. A method of generating mesh elements for semiconductor device simulation comprising the steps of:

storing in a computer data base a semiconductor device simulation wherein said simulation includes a geometric structure of a plurality of materials that make up the semiconductor device along with their respective chemical properties;

extracting a set of data representing boundaries for each of said materials within the structure wherein said boundaries form a plurality of distinct material regions;

subdividing each distinct material region according to a set of predefined geometric criteria to produce a coarse starting mesh consisting of mesh elements;

calculating geometric dimensions for each of said material regions by:

generating a plurality of normal lines from each of said boundaries; and for each normal line, calculating and storing a distance to an adjacent boundary;

identifying certain boundaries as semiconductor-insulator interfaces based upon said geometric definitions; and further subdividing certain mesh elements based upon their proximity to said semiconductor-insulator interfaces until a predetermined criteria is met.

15. The method of claim 14 wherein said starting mesh is comprised of triangular mesh elements.

16. The method of claim 14 wherein said step of subdividing each distinct material region according to a set of predefined geometric criteria is done with a laplacian smoothing algorithm.

17. The method of claim 14 wherein the calculating step calculates a thickness of each material region, and wherein said step of identifying certain boundaries as semiconductor-insulator interfaces includes the step of examining said thickness of each material region.

18. The method of claim 17 wherein said step of further subdividing certain mesh elements based upon their proximity to said semiconductor-insulator interfaces includes the step of marking mesh elements if, at some point, they border said semiconductor-insulator interface and if the bordered region is less than a predetermined thickness at that point.

19. The method of claim 18 wherein said marked mesh elements are examined and further subdivided if their furthest node is greater than a predetermined distance away from said semiconductor-insulator interface.

20. A program product that includes a computer usable medium having computer readable program code means embodied therein for generating a grid that can be used when simulating physical properties of a structure wherein said structure includes a plurality of materials subject to changing boundary layer conditions, said program product comprising;

means for accessing in a computer memory a geometric representation of said structure wherein said structure includes a plurality of boundaries for each of said materials;

means for calculating dimensions for each of said materials by computing a plurality of normal distances between adjacent boundaries within the structure;

means for identifying at least one interface material based on a calculated dimension of the at least one of said materials; and means for subdividing the structure with a recursive subdivision algorithm wherein the fineness of each subdivision is dependent upon its proximity to said at least one interface material.

21. The program product of claim 20 further comprising means for identifying certain materials as interface materials based upon their calculated dimensions.

22. A program product that includes a computer usable medium having computer readable program code means embodied therein for generating a plurality of mesh elements for use in semiconductor device simulation, said program product comprising:

means for accessing a computer database that contains a semiconductor simulation that includes a geometric structure of a plurality of materials;

means for extracting a set of data that represents boundaries for each of said materials within the structure wherein said boundaries delineate a plurality of distinct material regions;

means for subdividing each distinct material region according to a set of predefined geometric criteria to produce a coarse starting mesh consisting of mesh elements;

means for calculating geometric dimensions for each of said material regions by generating normal lines;

means for identifying certain boundaries as semiconductor-insulator interfaces; and means for further subdividing mesh elements based upon their proximity to said semiconductor-insulator interfaces.

* * * * *